(12) United States Patent
Hama et al.

(10) Patent No.: US 11,705,309 B2
(45) Date of Patent: Jul. 18, 2023

(54) SUBSTRATE PROCESSING METHOD

(71) Applicant: Tokyo Electron Limited, Tokyo (JP)

(72) Inventors: Yasutaka Hama, Miyagi (JP); Ryo Matsubara, Miyagi (JP); Nobuaki Shindo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 116 days.

(21) Appl. No.: 17/112,111

(22) Filed: Dec. 4, 2020

(65) Prior Publication Data
US 2021/0175049 A1  Jun. 10, 2021

(30) Foreign Application Priority Data

Dec. 6, 2019  (JP) .................................. 2019-220924

(51) Int. Cl.
C23C 16/04 (2006.01)
H01J 37/32 (2006.01)
C23C 16/46 (2006.01)

(52) U.S. Cl.
CPC .......... *H01J 37/3244* (2013.01); *C23C 16/46* (2013.01); *H01J 37/32697* (2013.01); *H01J 37/32724* (2013.01); *H01J 37/32816* (2013.01)

(58) Field of Classification Search
CPC ..... C23C 16/46; C23C 16/458; C23C 16/505; H01L 21/68; H01L 21/6831
See application file for complete search history.

(56) References Cited

U.S. PATENT DOCUMENTS 6,125,025 A * 9/2000 Howald .............. H01L 21/6833
                                                        279/128
6,721,162 B2 * 4/2004 Weldon ............... C23C 16/4586
                                                        279/128
(Continued)

FOREIGN PATENT DOCUMENTS

EP        0680083 A2 *  4/1995 ............. H01L 21/68
JP     2000021964 A      1/2000
(Continued)

OTHER PUBLICATIONS

Kanno, S., et al., "Prediction of clamping pressure in a Johnsen-Rahbeck-type electrostatic chuck based on a circuit simulation". Journal of Vacuum Science Technology B 24(1), Jan./Feb. 2006, pp. 216-223.*

(Continued)

*Primary Examiner* — Bret P Chen
(74) *Attorney, Agent, or Firm* — Nath, Goldberg & Meyer; Jerald L. Meyer; Tanya E. Harkins

(57) ABSTRACT

A temperature changing method includes changing a pressure of a gas supplied from a gas supply to a gap between the substrate and an electrostatic chuck from a first pressure to a second pressure being lower than the first pressure, changing a voltage applied to the electrostatic chuck from a first voltage to a second voltage being lower than the first voltage, changing a temperature of the electrostatic chuck from a first temperature to a second temperature, electrostatically attracting the substrate by the electrostatic chuck for a time in a state where the gas pressure is the second pressure and the voltage is the second voltage, changing the gas pressure from the second pressure to a third pressure being lower than the first pressure and higher than the second pressure, and changing the voltage from the second (Continued)

voltage to a third voltage being higher than the second voltage.

12 Claims, 9 Drawing Sheets

(56) References Cited

U.S. PATENT DOCUMENTS

| | | | |
|---|---|---|---|
| 2003/0155939 A1* | 8/2003 | Lutz | G01R 31/2865 324/750.09 |
| 2006/0158822 A1* | 7/2006 | Kondo | H02N 13/00 361/234 |
| 2006/0164786 A1* | 7/2006 | Kobayashi | H02N 13/00 361/234 |
| 2008/0089001 A1* | 4/2008 | Parkhe | H01L 21/6831 279/128 |
| 2008/0186647 A1* | 8/2008 | Kawajiri | H02N 13/00 427/180 |
| 2010/0254063 A1* | 10/2010 | Sheng | H01L 21/6833 118/723 R |
| 2012/0160808 A1* | 6/2012 | Kikuchi | H01L 21/6831 156/345.52 |
| 2016/0172227 A1* | 6/2016 | Hanson | H02N 13/00 361/234 |
| 2017/0066103 A1* | 3/2017 | Tomioka | B24B 37/20 |
| 2020/0357676 A1* | 11/2020 | Elliot | C04B 37/003 |
| 2021/0074523 A1* | 3/2021 | Ramachandran | H02N 13/00 |

FOREIGN PATENT DOCUMENTS

| | | | | |
|---|---|---|---|---|
| KR | 2000-0011428 | * | 2/2000 | H01L 21/68 |
| WO | WO 02-17384 A1 | * | 2/2002 | H01L 21/68 |
| WO | WO 02/17384 A1 | * | 2/2002 | H01L 21/68 |
| WO | WO 2005/036637 A1 | * | 4/2005 | H01L 21/68 |
| WO | WO 2016/094404 A1 | * | 6/2016 | H01L 21/683 |
| WO | WO 2021/021513 A1 | * | 2/2021 | H01L 21/683 |

OTHER PUBLICATIONS

Olson, Kurt A., et al., "Characterization, modeling, and design of an electrostatic chuck with improved wafer temperature uniformity". Review of Scientific Instruments, vol. 66, No. 2, 1108-1114 (1995).*
Kalkowski, G., et al., "Electrostatic chucks for lithography applications". Microelectronic Engineering 57-58 (2001) 219-222.*
Kim, Hyung-Ju, et al., "A Study on the Holding of LED Sapphire Substrate Using Alumina Electrostatic Chuck with Fine Electrode Pattern". Journal of the Korean Institute of Surface Engineering, vol. 44 Issue 4, pp. 165-171, 2011.*
Yuchun, Sun, et al., "Design space of electrostatic chuck in etching chamber". Journal of Semiconductors, vol. 36, No. 8, Aug. 2015, pp. 1-7.*
Bang, Jaecheol, "Fabrication and Characterization of High Temperature Electrostatic Chucks". The Korean Journal of Ceramics 5[1] 87-90 (1999).*
Shim, Gyu Il, et al., "Plasma Effects on Electrostatic Chuck Characteristics on Capacitive RF Discharge". Plasma and Fusion Research: Letters, vol. 2, 044 (2007) pp. 1-4.*
Fink, Bruce K., et al., "Design of a Resistive Susceptor for Uniform Heating During Induction Bonding of Composites". Army Research Laboratory, Jan. 2000, ARL-TR-2148.*

* cited by examiner

FIG. 1
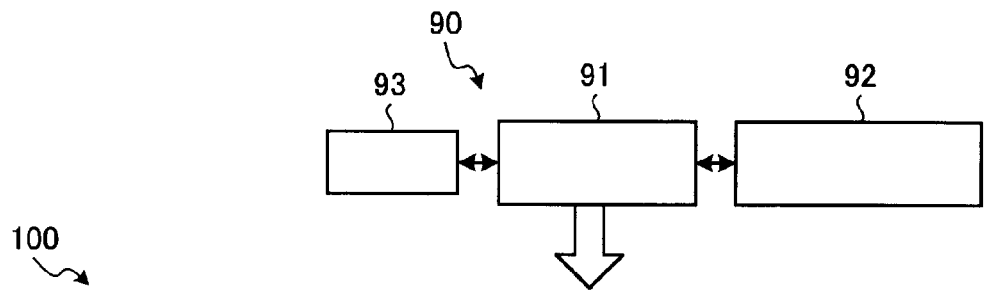
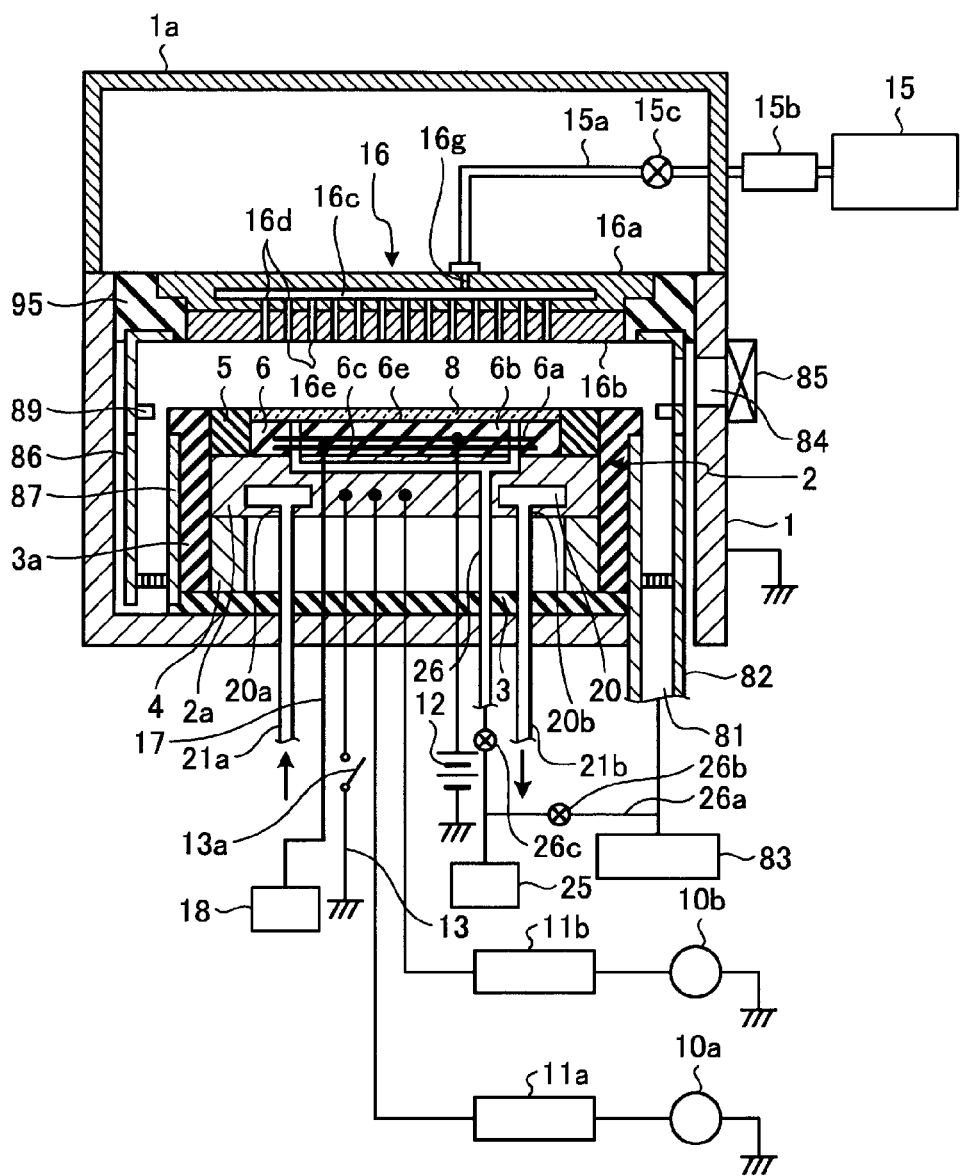

FIG. 6

| HV(V) | 2500 | ○ | ○ | ○ | ○ | ○ | ○ 0 |
|---|---|---|---|---|---|---|---|
| | 2000 | ○ | ○ | ○ | ○ | ○ | ○ 0.2 |
| | 1750 | ○ | ○ | ○ | ○ | ○ | ○ 0.2 |
| | 1500 | ○ | ○ | ○ | ○ | ○ 0.3 | ○ 0.4 |
| | 1400 | ○ | ○ | ○ | ○ | △ 0.5 | × 26 |
| | 1300 | ○ | ○ | ○ | ○ 0.3 | × 15.7 | × |
| | 1200 | ○ | ○ | ○ | × 4.4 | × | × |
| | 1100 | ○ | ○ | ○ 0.4 | × 4.4 | × | × |
| | 1000 | ○ | ○ 0.2 | △ 0.6 | × 14.6 | × | × |
| | 900 | ○ | ○ 0.3 | × 1.8 | × | × | × |
| | 800 | ○ | × 1.8 | × 4.2 | × | × | × |
| | 700 | ○ | × 3.8 | × 5.4 | × | × | × |
| | 600 | ○ | × | × | × | × | × |
| | 500 | ○ | × | × | × | × | × |
| He BP leak | | 0 | 10 | 15 | 20 | 25 | 30 |
| | | | | | BP(Torr) | | |

| <0.5:○ |
|---|
| 0.5~1.0:△ |
| >1.0:× |

SUBSTRATE PROCESSING METHOD

CROSS-REFERENCE TO RELATED APPLICATION

This application is based upon and claims the benefit of priority from Japanese Patent Application No. 2019-220924, filed on Dec. 6, 2019, the entire contents of which are incorporated herein by reference.

TECHNICAL FIELD

The present disclosure relates to a substrate processing method and a substrate processing apparatus.

BACKGROUND

Patent Document 1 discloses a technique for reducing particle generation by allowing a backside gas to flow between an attraction surface of an electrostatic chuck and a wafer to reduce a relative attraction force and to slide the wafer with respect to the attraction surface.

PRIOR ART DOCUMENT

Patent Document 1: Japanese Laid-Open Patent Publication No. 2000-21964

SUMMARY

A substrate processing method according to an aspect of the disclosure is a method of changing a temperature of a substrate by a substrate processing apparatus. The substrate processing apparatus has a processing chamber, a susceptor including an electrostatic chuck, and a gas supply unit. The susceptor is disposed in the processing chamber. The electrostatic chuck is capable of changing the temperature, and electrostatically attracts the substrate according to an applied voltage. The gas supply unit supplies a gas for heat transfer to a gap between the substrate disposed on the electrostatic chuck and the electrostatic chuck. The temperature changing method includes changing a pressure of the gas supplied from the gas supply unit to the gap between the substrate and the electrostatic chuck from a first pressure to a second pressure that is lower than the first pressure, changing the applied voltage applied to the electrostatic chuck from a first voltage to a second voltage that is lower than the first voltage, changing a temperature of the electrostatic chuck from a first temperature to a second temperature, electrostatically attracting and holding the substrate by the electrostatic chuck for a first time in a state where the pressure of the gas supplied from the gas supply unit is set to the second pressure and the applied voltage applied to the electrostatic chuck is set to the second voltage, changing the pressure of the gas supplied from the gas supply unit from the second pressure to a third pressure that is lower than the first pressure and higher than the second pressure, and changing the applied voltage applied to the electrostatic chuck from the second voltage to a third voltage that is higher than the second voltage.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a schematic cross-sectional view illustrating an example of a configuration of a substrate processing apparatus according to an embodiment;

FIG. 6 is a diagram illustrating a determination result based on a leak amount of a heat transfer gas;

DETAILED DESCRIPTION

Figure 2:
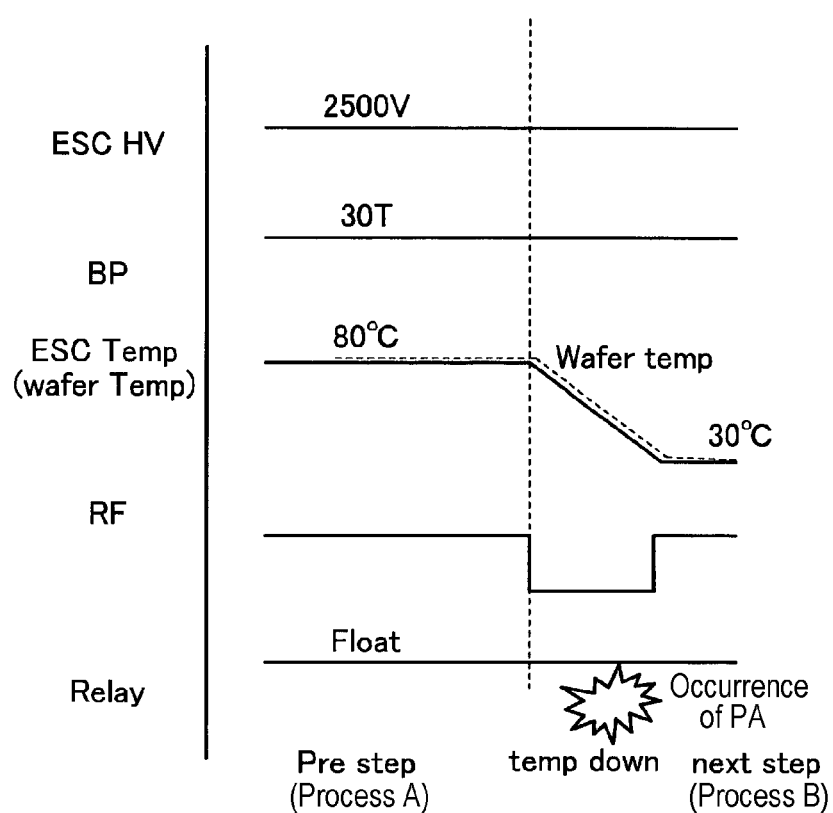
FIG. 2 is a timing chart illustrating an example of a substrate processing method in the related art.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a substrate processing method and a substrate processing apparatus disclosed in the present application will be described in detail with reference to the drawings. In addition, the disclosed substrate processing methods and substrate processing apparatuses are not limited to these embodiments.

In a substrate processing apparatus that performs substrate processing on a substrate, an electrostatic chuck (ESC) that electrostatically attracts the substrate is provided in order to stably hold the substrate. In addition, the substrate processing apparatus controls the temperature of the substrate attracted on the susceptor to a temperature suitable for substrate processing by changing the temperature of the susceptor. However, in the substrate processing apparatus, in a case where the temperature of the substrate and the temperature of the susceptor are changed in a state where the substrate is attracted, a contact portion between the substrate and the electrostatic chuck is rubbed due to a difference in thermal expansion coefficient between the substrate and the electrostatic chuck, so that particles occur.

Therefore, in the technique of Patent Document 1, a relative attraction force is reduced by allowing a gas to flow between the attraction surface of the electrostatic chuck and the wafer, and thus, the wafer is allowed to be slid with respect to the attraction surface.

However, in some cases, the gas flowing between the attraction surface of the electrostatic chuck and the substrate may leak from the outer periphery of the substrate, and due to the leaked gas, particles may fly up from the outer periphery of the substrate and may adsorb to the substrate. In the technique of Patent Document 1, since the gas is allowed to flow between the attraction surface of the electrostatic chuck and the substrate to reduce the attraction force, the amount of gas leaking from the outer periphery of the substrate is increased, and the particles easily fly up from the outer periphery of the substrate. Therefore, it is expected to suppress the adsorption of particles to the substrate.

Embodiment

[Apparatus Configuration]

An example of a substrate processing apparatus for performing a substrate processing method according to an embodiment will be described. In the embodiment, substrate processing will be described by employing plasma processing such as plasma etching as an example. In addition, a plasma processing apparatus will be described as an example. FIG. 1 is a schematic cross-sectional view illustrating an example of a configuration of a substrate processing apparatus 100 according to the embodiment. The substrate processing apparatus 100 has a processing chamber 1 which is configured to be airtight and is electrically set to a ground potential. The processing chamber 1 has a cylindrical shape and is made of, for example, aluminum. A processing space in which plasma is generated is formed inside the processing chamber 1. A susceptor 2 that horizontally supports a semiconductor wafer (hereinafter, simply referred to as a "wafer") 8 which is a substrate is provided in the processing chamber 1.

The susceptor 2 includes a base 2a and an electrostatic chuck (ESC) 6. The base 2a is configured with a conductive metal, for example, aluminum and serves as a lower electrode. The electrostatic chuck 6 has a function of electrostatically attracting the wafer 8. The susceptor 2 is supported by a support base 4. The support base 4 is further supported by a support member 3 made of a dielectric material such as quartz. In addition, an edge ring 5 made of, for example, single crystal silicon is provided on the outer periphery above the susceptor 2. Furthermore, in the processing chamber 1, a cylindrical inner wall member 3a made of a dielectric material such as quartz or ceramic is provided so as to surround the susceptor 2 and the support base 4.

A first radio frequency power supply 10a is coupled to the base 2a via a first matching unit 11a. A second radio frequency power supply 10b is coupled to the base 2a via a second matching unit 11b. The first radio frequency power supply 10a generates a radio frequency power for plasma generation. The radio frequency power for plasma generation has a predetermined frequency of 27 to 100 MHz or of 40 MHz in an example and is supplied to the base 2a of the susceptor 2 during the plasma processing. The second radio frequency power supply 10b generates a radio frequency power for ion attraction (for bias) having a predetermined frequency of 400 kHz to 13.56 MHz or of 3 MHz in an example, which is lower than that of the radio frequency power for plasma generation, and supplies the radio frequency power for ion attraction to the base 2a of the susceptor 2 during the plasma processing. In this manner, the susceptor 2 is configured to be capable of being applied with two radio frequency powers having different frequencies from the first radio frequency power supply 10a and the second radio frequency power supply 10b. On the other hand, a shower head 16 serving as an upper electrode is provided above the susceptor 2 so as to face the susceptor 2 in parallel. The shower head 16 and the susceptor 2 function as a pair of electrodes (upper electrode and lower electrode).

In addition, the base 2a is electrically grounded via a wiring 13. A switch 13a such as a relay switch is provided to the wiring 13. The base 2a can be electrically switched between a grounded state in which the base is grounded and a floating state by turning on and off the switch 13a.

The electrostatic chuck 6 is formed to have an upper flat surface in a disc shape. The upper surface of the electrostatic chuck 6 is set as a mounting surface 6e on which the wafer 8 is mounted. The electrostatic chuck 6 is configured by interposing an electrode 6a between insulators 6b. A DC power supply 12 is connected to the electrode 6a. The electrostatic chuck 6 attracts the wafer 8 by the Coulomb force generated by applying a DC voltage from the DC power supply 12 to the electrode 6a.

In the electrostatic chuck 6, a heater 6c is provided below the electrode 6a in the insulator 6b. The heater 6c is connected to a heater power supply 18 via a wiring 17. The heater power supply 18 supplies power to the heater 6c under the control of a control unit 90 described later. Accordingly, the heat generated by the heater 6c is controlled, and thus, the temperature of the wafer 8 disposed on the electrostatic chuck 6 is adjusted.

A flow channel 20 is formed inside the base 2a. A cooling medium inlet pipe 21a is connected to one end of the flow channel 20. A cooling medium outlet pipe 21b is connected to the other end of the flow channel 20. The cooling medium inlet pipe 21a and the cooling medium outlet pipe 21b are connected to a chiller unit (not illustrated). The flow channel 20 is located below the wafer 8 to remove the heat of the wafer 8. The substrate processing apparatus 100 is capable of controlling the susceptor 2 to a predetermined temperature by circulating a cooling medium, for example, cooling water, an organic solution such as Galden, in the flow channel 20 from the chiller unit via the cooling medium inlet pipe 21a and the cooling medium outlet pipe 21b.

The substrate processing apparatus 100 further includes a heat transfer gas supply unit 25 and a gas supply line 26. The gas supply line 26 has one end connected to a through hole formed in the electrostatic chuck 6 and the other end connected to the heat transfer gas supply unit 25. In addition, a gas supply line 26a is branched from the gas supply line 26 on the way. The branched gas supply line 26a is connected to an exhaust device 83. The exhaust device 83 may include a vacuum pump and perform exhausts by operating the vacuum pump. A valve 26b that can be opened and closed is provided in the gas supply line 26a. In addition, the gas supply line 26 is provided with a valve 26c that can be opened and closed at one end side from a branch point where the gas supply line 26a is branched. The opening and closing of the valves 26b and 26c are controlled by the control unit 90 described later.

The heat transfer gas supply unit 25 is connected to a gas supply source that supplies the heat transfer gas. The heat transfer gas supply unit 25 is provided with a mass flow controller and an on-off valve and supplies the heat transfer gas at a designated flow rate to the gas supply line 26 under the control of the control unit 90 described later. Examples of the heat transfer gas include He (helium) gas and Ar (argon) gas. In a case where the valve 26b is set to the closed state and the valve 26c is set to the opened state, the heat transfer gas supplied from the heat transfer gas supply unit 25 is supplied between the wafer 8 mounted on the susceptor 2 and the electrostatic chuck 6 via the gas supply line 26. On the other hand, in a case where the valve 26b is set to the opened state and the valve 26c is set to the closed state, the heat transfer gas supplied from the heat transfer gas supply unit 25 is exhausted to the exhaust device 83 via the gas supply line 26a. In a case where the heat transfer gas is supplied from the heat transfer gas supply unit 25 between the wafer 8 and the electrostatic chuck 6, the valve 26b is set to the closed state and the valve 26c is set to the opened state.

The shower head 16 is provided on the ceiling wall portion of the processing chamber 1. The shower head 16 includes a main body 16a and an upper ceiling plate 16b constituting an electrode plate. The shower head 16 is supported on the upper portion of the processing chamber 1 via an insulating member 95. The main body 16a is made of a conductive material, for example, aluminum where its surface is anodized. The main body 16a detachably supports the upper ceiling plate 16b on the lower portion (surface) thereof.

A gas diffusion chamber 16c is provided inside the main body 16a. In addition, the main body 16a has a large number of gas flow holes 16d formed in the lower portion of the gas diffusion chamber 16c. The upper ceiling plate 16b is provided so that gas introduction holes 16e overlap with the gas flow holes 16d so as to penetrate the upper ceiling plate 16b in the thickness direction. With such a configuration, the processing gas supplied to the gas diffusion chamber 16c is dispersed and supplied into the processing chamber 1 via the gas flow holes 16d and the gas introduction holes 16e.

A gas inlet 16g for introducing the processing gas into the gas diffusion chamber 16c is formed in the main body 16a. One end of a gas supply pipe 15a is connected to the gas inlet 16g. The other end of the gas supply pipe 15a is connected to a processing gas supply source 15 for supplying the processing gas. A mass flow controller (MFC) 15b and an on-off valve 15c in this order from the upstream side are provided to the gas supply pipe 15a. A processing gas for plasma etching is supplied from the processing gas supply source 15 to the gas diffusion chamber 16c via the gas supply pipe 15a. The processing gas is dispersed to be supplied into the processing chamber 1 from the gas diffusion chamber 16c via the gas flow holes 16d and the gas introduction holes 16e.

A cylindrical ground conductor 1a is provided so as to extend from the side wall of the processing chamber 1 to a position higher than the height of the shower head 16. The cylindrical ground conductor 1a has a ceiling wall at the top thereof.

An exhaust port 81 is formed at the bottom of the processing chamber 1. The exhaust device 83 is connected to the exhaust port 81 via an exhaust pipe 82. The exhaust device 83 decompresses the inside of the processing chamber 1 to a predetermined degree of vacuum by operating a vacuum pump. On the other hand, a loading/unloading port 84 for the wafer 8 is provided on the side wall of the processing chamber 1. A gate valve 85 for opening/closing the loading/unloading port 84 is provided to the loading/unloading port 84.

A first shield member (deposition-shield) 86 is provided inside the side portion of the processing chamber 1 along the inner wall surface. The first shield member 86 prevents the etching by-product (deposition) from adsorbing to the processing chamber 1. A conductive member (GND block) 89 connected such that a potential with respect to the ground can be controlled is provided at a position substantially the same height as the wafer 8 on the first shield member 86, so that abnormal discharge is prevented. A second shield member 87 extending along the inner wall member 3a is provided at the lower end of the first shield member 86. The first shield member and the second shield member 86 and 87 are detachable.

The operations of the substrate processing apparatus 100 having the above-described configuration are controlled totally by the control unit 90. A processing controller 91 having a CPU to control each unit of the substrate processing apparatus 100, a user interface 92, and a storage unit 93 are provided in the control unit 90.

The user interface 92 includes a keyboard through which a processing manager performs input operation of commands to manage the substrate processing apparatus 100, a display which visualizes and displays the operating situation of the substrate processing apparatus 100, and the like.

The storage unit 93 is a non-transitory storage medium that stores a control program (software) for realizing various types of processing executed by the substrate processing apparatus 100 under the control of the processing controller 91 and a recipe that stores processing condition data. Then, if necessary, by calling any recipe from the storage unit 93 and allowing the processing controller 91 to execute the recipe by an instruction from the user interface 92, under the control of the processing controller 91, desired processing in the substrate processing apparatus 100 is performed.

[Substrate Processing Method]

Next, a substrate processing method for the wafer 8 by the substrate processing apparatus 100 will be described. The substrate processing apparatus 100 can control the temperature of the wafer 8 disposed on the electrostatic chuck 6 by controlling the heater 6c. In the substrate processing, the substrate processing apparatus 100 controls the temperature of the wafer 8 by controlling the heater 6c. The substrate processing apparatus 100 may perform a plurality of processes in processing the substrate. For example, in the case of etching the wafer 8 on which the multi-layered film is formed, the substrate processing apparatus 100 performs a plurality of plasma processing with different processing conditions such as the temperature of the wafer 8 as a plurality of processes. In performing a plurality of processes, the substrate processing apparatus 100 controls the temperature of the wafer 8 to a temperature suitable for each process. In this case, the substrate processing apparatus 100 changes the temperature of the wafer 8 between the processes.

FIG. 2 is a timing chart illustrating an example of a substrate processing method in the related art. FIG. 2 illustrates a case where the process B is performed on the wafer 8 after the process A. The process A and the process B are, for example, plasma processing for etching the multi-layered film formed on the wafer 8. The temperature of the wafer 8 suitable for the process A is 80° C. The temperature of the wafer 8 suitable for the process B is 30° C. FIG. 2 illustrates the applied voltage HV (ESC HV) applied to the electrostatic chuck 6 and the pressure BP (Torr) of the heat transfer gas supplied from the heat transfer gas supply unit 25 as a backside gas between the wafer 8 and the electrostatic chuck 6. In addition, FIG. 2 illustrates the temperature (ESC Temp) of the electrostatic chuck 6 and the radio frequency power RF supplied from the first radio frequency power supply 10a and the second radio frequency power supply 10b to the base 2a of the susceptor 2. In the temperature (ESC Temp) of the electrostatic chuck 6, the temperature (Wafer Temp) of the wafer 8 is also indicated by a broken line. In addition, FIG. 2 illustrates an electrical state of the base 2a of the susceptor 2 by turning on and off the switch 13a (Relay).

As illustrated in FIG. 2, in a first process (process A) performed before, the applied voltage HV to the electrostatic chuck (ESC) 6 is set to 2500 V. In addition, in the first process, the valve 26b is set to the closed state, the valve 26c is set to the opened state, and the heat transfer gas is supplied from the heat transfer gas supply unit 25 between the wafer 8 and the electrostatic chuck 6 at 30 Torr. In the first process, the radio frequency power RF according to the first process is supplied from the first radio frequency power supply 10a and the second radio frequency power supply 10b to the base 2a of the susceptor 2, and the switch 13a is turned off, so that the base 2a of the susceptor 2 is in a floating state.

In the substrate processing method in the related art illustrated in FIG. 2, when the temperature of the wafer 8 is changed, the radio frequency power RF supplied from the first radio frequency power supply 10a and the second radio frequency power supply 10b is turned off to be changed to 0 W, and the temperature of the electrostatic chuck 6 and the temperature of the wafer 8 are changed from 80° C. to 30° C. With respect to the applied voltage HV (V), the pressure BP (Torr) of the heat transfer gas, and the electrical state of the base 2a, the state of the first process is maintained even when the temperature of the wafer 8 is changed.

However, in the substrate processing apparatus 100, in a case where the temperature of the electrostatic chuck 6 and the temperature of the wafer 8 are changed in a state where the wafer 8 is electrostatically attracted on the electrostatic chuck 6, the particles (PA) may occur.

Figure 3:
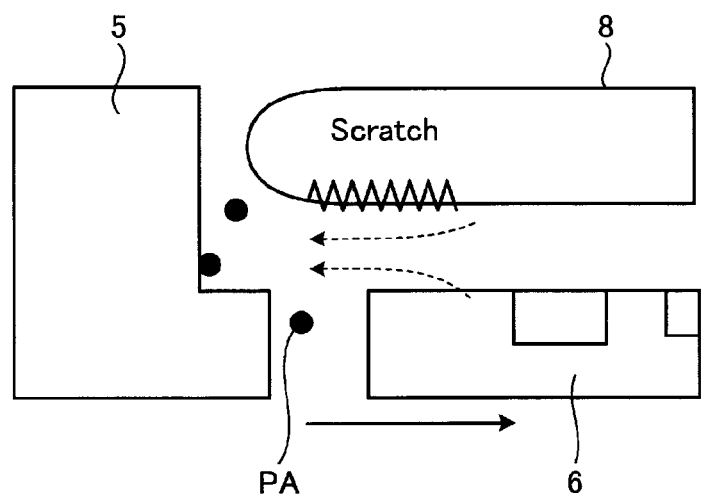
FIG. 3 is a diagram for describing a cause of occurrence of particles.

As a result of investigating the occurrence of these particles, the following causes of the occurrence were found. FIG. 3 is a diagram for describing the causes of the occurrence of the particles. FIG. 3 schematically illustrates a configuration near the outer periphery of the susceptor 2. The wafer 8 is disposed on the electrostatic chuck 6. The wafer 8 and the electrostatic chuck 6 respectively expand or contract according to the change in temperature. However, in a case where the temperature of the wafer 8 and the temperature of the susceptor 2 are changed in a state where the wafer 8 is attracted on the electrostatic chuck 6, the contact portion between the wafer 8 and the electrostatic chuck 6 is rubbed and scratched by the difference in thermal expansion coefficient between the wafer 8 and the electrostatic chuck 6, so that the particles PA occur. In the substrate processing method in the related art, since the heat transfer gas is supplied between the attraction surface of the electrostatic chuck 6 and the wafer 8 to reduce the attraction force, the heat transfer gas leaks from the outer periphery of the wafer 8. The occurring particles PA fly up from the outer periphery of the wafer 8 into the processing chamber 1 by the heat transfer gas leaking from the outer periphery of the wafer 8. Accordingly, the particles PA are adsorbed on the surface of the wafer 8.

Figure 4:
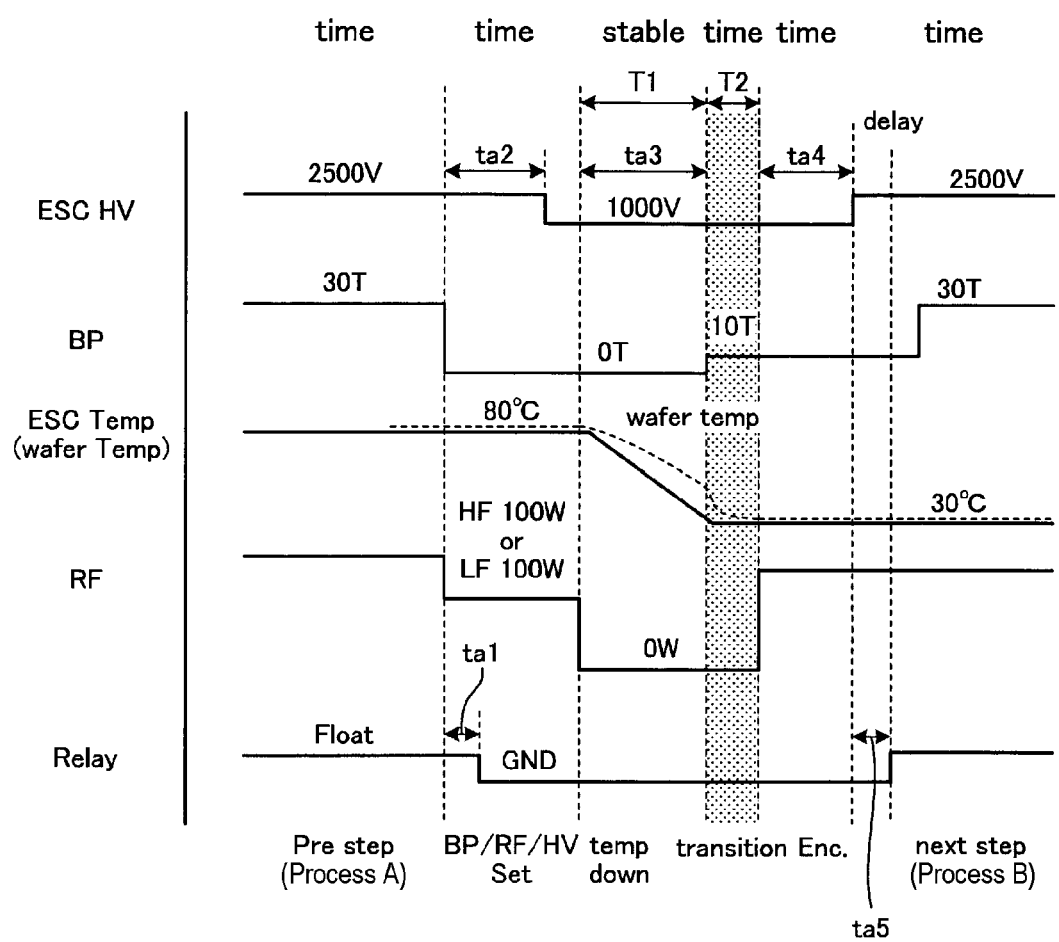
FIG. 4 is a timing chart illustrating an example of a substrate processing method according to the embodiment.

Therefore, when the temperature of the wafer 8 is changed, the substrate processing apparatus 100 according to the embodiment performs the substrate processing method according to the embodiment described below. FIG. 4 is a timing chart illustrating an example of the substrate processing method according to the embodiment. Similarly to FIG. 2, FIG. 4 illustrates a case where the process B is performed on the wafer 8 after the process A as the plasma processing. The temperature of the wafer 8 suitable for the process A is 80° C. The temperature of the wafer 8 suitable for the process B is 30° C. FIG. 4 illustrates the applied voltage HV (ESC HV) applied to the electrostatic chuck 6 and the pressure BP (Torr) of the heat transfer gas supplied from the heat transfer gas supply unit 25 as the backside gas between the wafer 8 and the electrostatic chuck 6. In addition, FIG. 4 illustrates the temperature (ESC Temp) of the electrostatic chuck 6 and the radio frequency power RF supplied from the first radio frequency power supply 10a and the second radio frequency power supply 10b to the base 2a of the susceptor 2. In the temperature (ESC Temp) of the electrostatic chuck 6, the temperature (Wafer Temp) of the wafer 8 is also indicated by a broken line. In addition, FIG. 4 illustrates an electrical state of the base 2a of the susceptor 2 by turning on and off the switch 13a (Relay).

As illustrated in FIG. 4, in the first process (process A), the applied voltage HV is set to 2500 V. In addition, in the first process, the valve 26b is set to the closed state, the valve 26c is set to the opened state, and the heat transfer gas is supplied from the heat transfer gas supply unit 25 to a gap between the wafer 8 and the electrostatic chuck 6 at 30 Torr. In the first process, the radio frequency power RF according to the first process is supplied from the first radio frequency power supply 10a and the second radio frequency power supply 10b to the base 2a of the susceptor 2, and the switch 13a is turned off, so that the base 2a of the susceptor 2 is in a floating state.

In the substrate processing method according to the embodiment illustrated in FIG. 4, when the temperature of the wafer 8 is changed, the pressure of the heat transfer gas supplied from the heat transfer gas supply unit 25 to the gap between the wafer 8 and the electrostatic chuck 6 is changed from a first pressure to a second pressure that is lower than the first pressure. For example, the control unit 90 controls the heat transfer gas supply unit 25 and changes the pressure BP of the heat transfer gas supplied from the heat transfer gas supply unit 25 to 0 Torr. Accordingly, the flying-up of the particles from the outer periphery of the wafer 8 can be suppressed. In addition, the control unit 90 controls the valves 26b and 26c to be in the closed state to exhaust the heat transfer gas from the heat transfer gas supply unit 25 via the gas supply line 26a.

Next, in the substrate processing method according to the embodiment, the applied voltage HV applied to the electrostatic chuck 6 is changed from the first voltage to the second voltage that is lower than the first voltage.

Herein, in the substrate processing method for the wafer 8 in the related art illustrated in FIG. 2, when the temperature of the wafer 8 is changed, since it is not necessary to generate plasma, the radio frequency power RF is turned off to be changed to 0 W.

However, in a case where the applied voltage HV is changed, in order to avoid a rapid change in potential of the wafer 8, it is preferable that radio frequency power is supplied to the susceptor 2. In addition, in order to suppress a change in potential of the susceptor 2 to reduce the discharge risk, it is preferable to maintain the susceptor 2 in a grounded state.

Therefore, in the substrate processing method according to the embodiment, when the applied voltage HV is changed, the radio frequency power at a lower level than that in the plasma processing is supplied to the susceptor 2. In addition, in the substrate processing according to the embodiment, the susceptor 2 is in the grounded state during the period in which the temperature of the wafer 8 is changed. For example, the control unit 90 controls the first radio frequency power supply 10a and the second radio frequency power supply 10b and supplies at least one of the radio frequency power HF for plasma generation and the radio frequency power LF for bias. In the example of FIG. 4, the power is allowed to be lower than the radio frequency power RF of the first process (process A) to supply 100 W of the radio frequency power HF for plasma generation or 100 W of the radio frequency power LF for bias. In addition, the control unit 90 turns on the switch 13a to set the base 2a of the susceptor 2 to the grounded state. In FIG. 4, the base 2a of the susceptor 2 is at the GND potential with a delay of an operation standby time ta1 of the switch 13a from the reduction in the radio frequency power RF. The control unit 90 controls the DC power supply 12 after a standby time ta2 after changing to reduce the radio frequency power RF, and changes the applied voltage HV from 2500 V to 1000 V. Accordingly, it is possible to suppress a rapid change in potential of the wafer 8 when the applied voltage HV is changed. In addition, by setting the susceptor 2 to the grounded state, it is possible to suppress a change in potential of the susceptor 2 to reduce the discharge risk.

Next, in the substrate processing method according to the embodiment, the temperature of the susceptor 2 is changed from the first temperature to the second temperature. In addition, in the substrate processing method according to the embodiment, when the temperature of the susceptor 2 is changed from the first temperature to the second temperature, the radio frequency power supplied to the susceptor 2 is turned off. For example, the control unit 90 controls the heater power supply 18 to reduce the heat generation amount of the heater 6c and changes the temperature of the susceptor 2 from 80° C. to 30° C. In addition, the control unit 90 controls the first radio frequency power supply 10a and the second radio frequency power supply 10b and turns off the radio frequency power HF for plasma generation and the radio frequency power LF for bias to set the radio frequency power RF to 0 W.

Next, in the substrate processing method according to the embodiment, in a state where the pressure of the heat transfer gas supplied from the heat transfer gas supply unit 25 is set to the second pressure and the applied voltage HV applied to the electrostatic chuck 6 is set to the second voltage, the wafer 8 is electrostatically attracted and held by the electrostatic chuck 6 for the first time. For example, the control unit 90 maintains the state where the pressure BP of the heat transfer gas supplied from the heat transfer gas supply unit 25 is set to 0 Torr and the applied voltage HV applied to the electrostatic chuck 6 is set to 1000 V for a time ta3. Accordingly, the temperature of the susceptor 2 is decreased. The temperature of the wafer 8 electrostatically attracted on the electrostatic chuck 6 is decreased as the temperature of the susceptor 2 is decreased. The time ta3 is the time when the temperature of the wafer 8 is decreased to a temperature close to the temperature of the susceptor 2 and is set in advance by experiments or simulations.

Next, in the substrate processing method according to the embodiment, the pressure of the heat transfer gas supplied from the heat transfer gas supply unit 25 is changed from the second pressure to a third pressure that is lower than the first pressure and higher than the second pressure. For example, the control unit 90 controls the heat transfer gas supply unit 25 and changes the pressure BP of the heat transfer gas supplied from the heat transfer gas supply unit 25 to 10 Torr. By increasing the pressure BP of the heat transfer gas supplied from the heat transfer gas supply unit 25, heat is transferred by the heat transfer gas, and the temperature of the wafer 8 electrostatically attracted on the electrostatic chuck 6 is changed rapidly to the temperature of the susceptor 2.

Next, in the substrate processing method according to the embodiment, the applied voltage HV applied to the electrostatic chuck 6 is changed from the second voltage to a third voltage that is higher than the second voltage.

Herein, as described above, in a case where the applied voltage HV is changed, in order to avoid a rapid change in potential of the wafer 8, it is preferable that radio frequency power is supplied to the susceptor 2.

Therefore, in the substrate processing method according to the embodiment, a radio frequency power is supplied to the susceptor 2 when the applied voltage HV is changed. For example, the control unit 90 controls the first radio frequency power supply 10a and the second radio frequency power supply 10b and supplies the radio frequency power HF for plasma generation and the radio frequency power LF for biasing of the second process (process B) to be performed next. The control unit 90 controls the DC power supply 12 to change the applied voltage HV from 1000 V to 2500 V after a standby time ta4 after changing to increase the radio frequency power RF. In addition, in order to suppress the change in potential of the susceptor 2 and reduce the discharge risk, the control unit 90 turns off the switch 13a to set the base 2a of the susceptor 2 to a floating state. In FIG. 4, the base 2a of the susceptor 2 is in the floating state with a delay of an operation standby time ta5 of the switch 13a from the increase of the radio frequency power RF.

The substrate processing apparatus 100 can suppress the adsorption of particles to the wafer 8 by changing the temperature of the wafer 8 by the substrate processing method according to the embodiment.

In the substrate processing method according to the embodiment, after the voltage is changed to the third voltage, the pressure of the gas supplied from the heat transfer gas supply unit 25 is changed from the third pressure to a fourth pressure higher than the third pressure. For example, the control unit 90 controls the heat transfer gas supply unit 25 and changes the pressure BP of the heat transfer gas supplied from the heat transfer gas supply unit 25 to 30 Torr of the second process (process B).

The substrate processing apparatus 100 performs the second process (process B) on the wafer 8 where temperature has been changed to 30° C. by the substrate processing method according to the embodiment.

In the substrate processing method according to the embodiment, in a case where the temperature of the wafer 8 is changed between the first process (process A) and the second process (process B), the adsorption of particles to the wafer 8 is suppressed to change the temperature of the wafer 8.

[Appropriate Ranges of Pressure BP of Heat Transfer Gas and Applied Voltage HV]

Next, an example of appropriate ranges of the pressure BP of heat transfer gas and the applied voltage HV to the electrostatic chuck 6 when the temperature of the wafer 8 is changed will be described.

As illustrated in FIG. 3, particles occur when the contact portion between the wafer 8 and the electrostatic chuck 6 is rubbed and the surface is scratched. Therefore, for example, in a case where the applied voltage HV is decreased to reduce the attraction force between the wafer 8 and the electrostatic chuck 6, it is possible to suppress the scratching of the surfaces of the wafer 8 and the electrostatic chuck 6, and it is possible to suppress the occurrence of particles.

Figure 5:
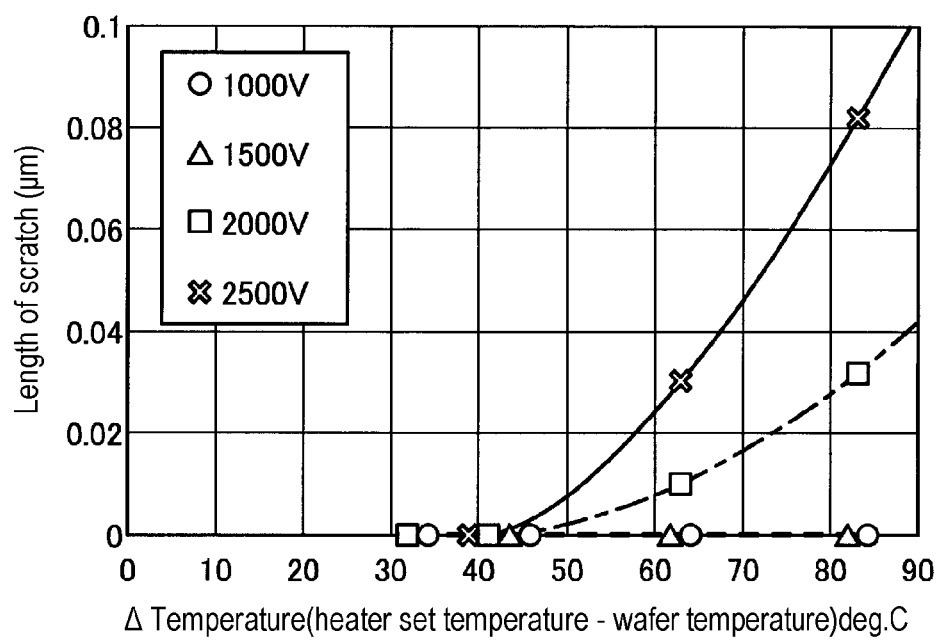
FIG. 5 is a diagram illustrating lengths of scratches occurring on a wafer according to an applied voltage applied to an electrostatic chuck.

FIG. 5 is a diagram illustrating the lengths of scratches occurring on the wafer 8 for each applied voltage HV applied to the electrostatic chuck 6. FIG. 5 illustrates the lengths of scratches occurring on the wafer 8 with respect to the temperature difference $\Delta t$ between the wafer 8 and the electrostatic chuck 6 in a case where the applied voltage HV is set to 1000 V, 1500 V, 2000 V, and 2500 V, respectively. In a case where the applied voltage HV is 2000 V, when the temperature difference $\Delta t$ becomes large, the scratches occur in the wafer 8. In a case where the applied voltage HV is 2500 V, the scratches occurring on the wafer 8 are longer than those of a case where the applied voltage HV is 2000 V. On the other hand, in a case where the applied voltage HV is 1000 V and 1500 V, scratches generally do not occur. Therefore, in the case of suppressing the occurrence of scratches, the applied voltage HV is preferably 1500 V or less, and more preferably 1000 V or less.

In the substrate processing apparatus 100, the wafer 8 is attracted on the electrostatic chuck 6, so that the leakage of the heat transfer gas supplied between the wafer 8 and the electrostatic chuck 6 is suppressed to be small. In the substrate processing apparatus 100, in a case where the applied voltage HV applied to the electrostatic chuck 6 is decreased, the electrostatic attraction force of the wafer 8 by the electrostatic chuck 6 is reduced, and the leakage of the heat transfer gas becomes large.

FIG. 6 is a diagram illustrating a determination result based on the leak amount of the heat transfer gas. FIG. 6 illustrates the leak amount of the heat transfer gas by numerical in a case where the pressure BP of the heat transfer gas supplied from the heat transfer gas supply unit 25 is set to 0 to 30 Torr and the applied voltage HV is set to 500 to 2500 V.

Figure 7:
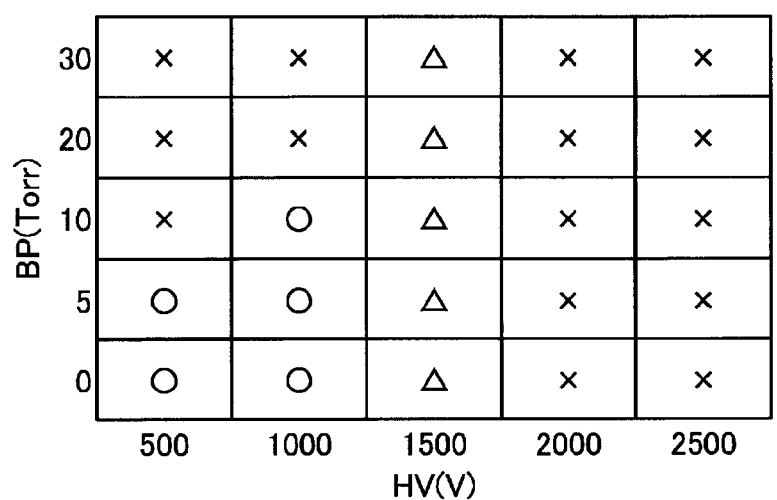
FIG. 7 is a diagram summarizing the determination results of FIGS. 5 and 6.
Figure 9:
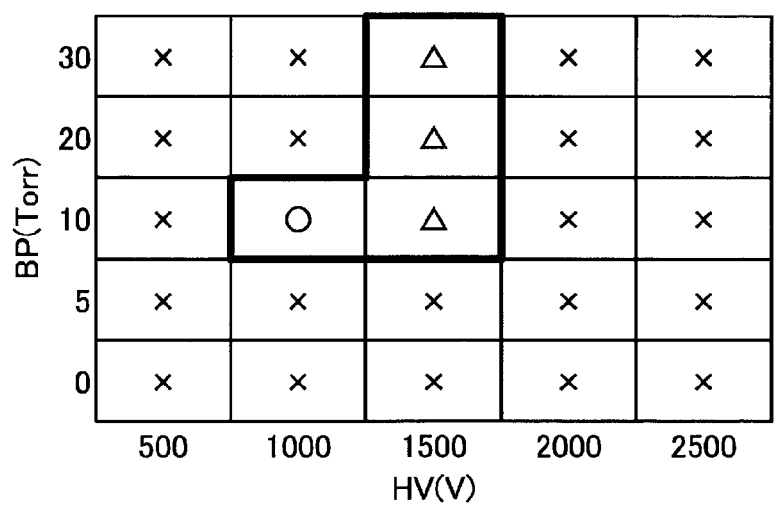
FIG. 9 is a diagram summarizing the determination results of FIGS. 5, 6, and 8.

In order to suppress the leakage of the heat transfer gas, it is necessary to increase the applied voltage HV as the pressure BP of the heat transfer gas supplied from the heat transfer gas supply unit 25 increases. In the substrate processing apparatus 100, since the wafer shift and the wafer peeling are likely to occur, it is preferable that the leakage of the heat transfer gas is small. For example, the leak amount of the heat transfer gas of more than 1.0 is not preferable. The leak amount of 1.0 or less is preferable, and the leak amount of less than 0.5 is more preferable. In FIGS. 6, 7 and 9, non-preferable results are marked with "×", a preferable results are marked with "Δ", more preferable results are marked with "○". In FIG. 6, a portion where the leak amount of the heat transfer gas is less than 0.5 is marked with "○", and a portion where the leak amount is from 0.5 to 1.0 is marked with "Δ", and a portion where the leak amount is more than 1.0 is marked with "×". For example, in a case where the pressure BP of the heat transfer gas supplied from the heat transfer gas supply unit 25 is 30 Torr, the applied voltage HV is preferably set to 1500 V or more.

Thus, in order to suppress the occurrence of scratches, it is preferable to lower the applied voltage HV. However, in order to suppress the leak amount of the heat transfer gas, it is necessary to attract the wafer 8 to the electrostatic chuck 6 while allowing the applied voltage HV not to be too low.

FIG. 7 is a diagram summarizing the determination results of FIGS. 5 and 6. FIG. 7 reflects the range of the applied voltage HV in which the occurrence of scratches is suppressed, which is obtained from the result of FIG. 5. In FIG. 7, a portion of the applied voltage HV of 1500 V is marked with "Δ" and a portion of 1000 V or less is marked with "○". The portion where the applied voltage HV is 2000 V or larger is marked with "×". FIG. 7 further reflects the range in which the leakage of the heat transfer gas can be suppressed, which is illustrated in FIG. 6. In FIG. 7, a portion where the pressure BP of the heat transfer gas is 10 Torr or more in a case where the applied voltage HV is 500 V and a portion where the pressure BP of the heat transfer gas is 20 Torr or more in a case where the applied voltage HV is 1000 V are changed to "×".

In the substrate processing method according to the embodiment illustrated in FIG. 4, in a period T1 in which the temperature of the electrostatic chuck 6 is changed, the applied voltage HV is decreased to reduce the attraction force between the wafer 8 and the electrostatic chuck 6, and the pressure BP of the heat transfer gas is decreased. Then, in the substrate processing method according to the embodiment, the pressure BP of the heat transfer gas is increased to 10 Torr in a period T2. The change in temperature of the wafer 8 in the period T1 and the period T2 will be described.

Figure 8:
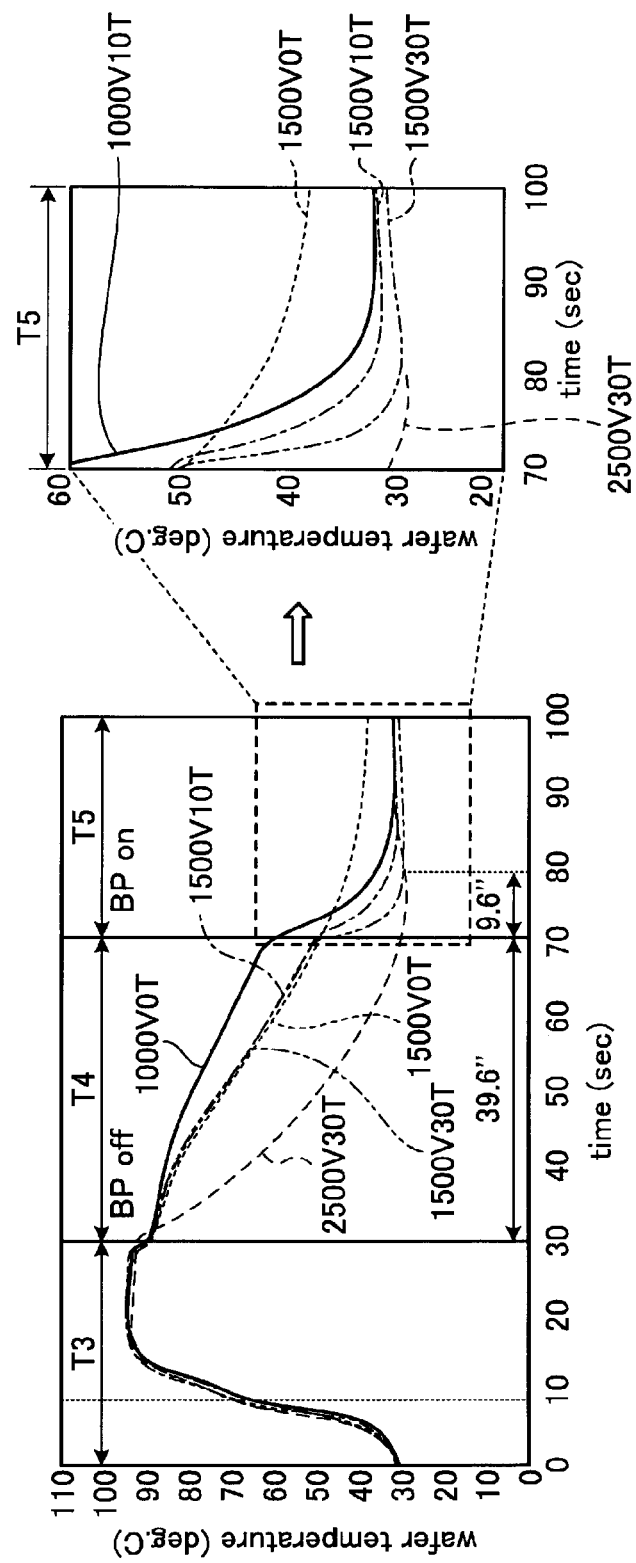
FIG. 8 is a diagram illustrating a change in temperature of the wafer.

FIG. 8 is a diagram illustrating the change in temperature of the wafer 8. In FIG. 8, after the temperature of the wafer 8 is set to about 90° C. in a period T3, the temperature of the wafer 8 is changed to 30° C. in periods T4 and T5. In the period T3, the temperature of the wafer 8 in the first process (process A) of FIG. 4 is reproduced. In the periods T4 and T5, the temperature of the wafer 8 in the periods T1 and T2 of FIG. 4 is reproduced. In the period T3, the temperature of the wafer 8 is heated to about 90° C. by setting the applied voltage HV to 2500 V and setting the pressure BP of the heat transfer gas to 30 Torr. On the right side of FIG. 8, an enlarged view in which the broken-line portion of the period T5 is enlarged is illustrated.

"1000V10T" in FIG. 8 indicates a change in temperature of the wafer 8 in a case where the applied voltage HV is set to 1000 V and the pressure BP of the heat transfer gas is set to 0 Torr in the period T4, and the pressure BP of the heat transfer gas is changed to 10 Torr in the period T5. "1500V0T" indicates a change in temperature of the wafer 8 in a case where the applied voltage HV is set to 1500 V and the pressure BP of the heat transfer gas is set to 0 Torr in the period T4, and the pressure BP of the heat transfer gas is maintained at 0 Torr in the period T5. "1500V10T" indicates a change in temperature of the wafer 8 in a case where the applied voltage HV is set to 1500 V and the pressure BP of the heat transfer gas is set to 0 Torr in the period T4, and the pressure BP of the heat transfer gas is changed to 10 Torr in the period T5. "1500V30T" indicates a change in temperature of the wafer 8 in a case where the applied voltage HV is set to 1500 V and the pressure BP of the heat transfer gas is set to 0 Torr in the period T4, and the pressure BP of the heat transfer gas is changed to 30 Torr in the period T5. "2500V30T" indicates a change in temperature of the wafer 8 in a case where the applied voltage HV is set to 2500 V and the pressure BP of the heat transfer gas is set to 30 Torr in the periods T4 and T5 similarly to the period T3.

In "2500V30T", the temperature of the wafer 8 can be changed rapidly to 30° C. However, in "2500V30T", since the voltage is applied to the electrostatic chuck 6 and the pressure BP of the heat transfer gas is maintained even in the periods T4 and T5 similarly to the period T3, particles fly up from the outer periphery of the wafer 8 to the inside of the processing chamber 1.

In "1500V0T", "1500V10T", and "1500V30T", the temperature of the wafer 8 is similarly decreased in the period T4. In "1500V10T" and "1500V30T", the temperature of the wafer 8 is changed rapidly to around 30° C. by supplying the heat transfer gas in the period T5. On the other hand, in "1500V0T", since the pressure BP of the heat transfer gas is set to 0 Torr even in the period T5, the heat transfer is decreased, the temperature followability of the wafer 8 is decreased, and thus, it takes time to decrease the temperature of the wafer 8.

"1000V10T" has a lower degree of change in temperature than "1500V10T" in the period T4, but the temperature of the wafer 8 is decreased, and the temperature of the wafer 8 is changed rapidly to around 30° C. by supplying the heat transfer gas in the period T5. Therefore, from the viewpoint of the change in temperature, it is preferable that the pressure BP of the heat transfer gas is set to 10 Torr or more.

FIG. 9 is a diagram summarizing the determination results of FIGS. 5, 6, and 8. FIG. 9 illustrates the result of reflecting the range in which the temperature of the wafer 8 can be changed rapidly, which is illustrated in FIG. 8, with respect to FIG. 7. In FIG. 9, since the temperature of the wafer 8 cannot be changed rapidly, the portion where the pressure BP of the heat transfer gas is 5 Torr or less is changed to "x" from FIG. 7.

From the results illustrated in FIG. 9, in the substrate processing method according to the embodiment, it is preferable that the applied voltage HV is set to 1000 V to 1500 V and the pressure BP of the heat transfer gas is set to 10 Torr or less, preferably 0 Torr in the period T1 of FIG. 4. In the period T2, it is preferable that the pressure BP of the heat transfer gas is set to 10 Torr. In addition, in the period T1, it is more preferable that the applied voltage HV is set to 1000 V and the pressure BP of the heat transfer gas is set to 0 Torr. In the period T2, it is more preferable that the pressure BP of the heat transfer gas is set to 10 Torr.

[Change in Number of Particles]

Figure 10:
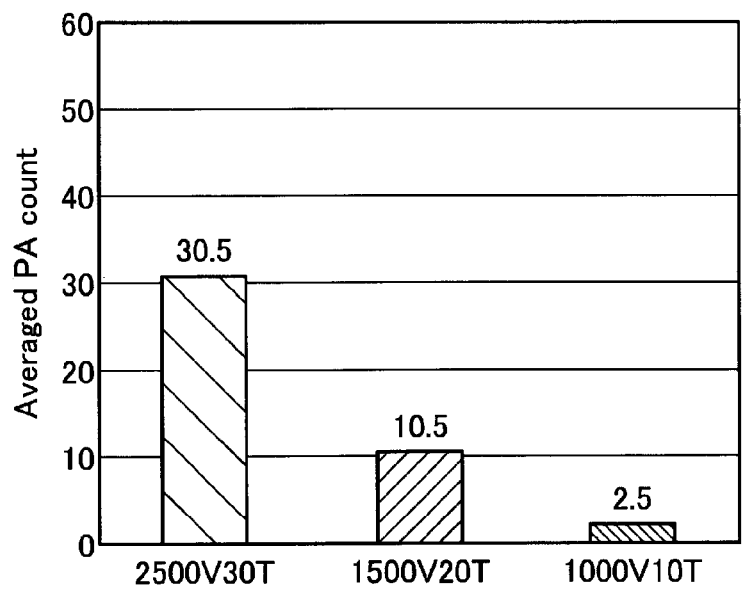
FIG. 10 is a graph showing average values of particles adsorbing to an edge region of the wafer.

Next, an experimental result of counting particles actually adsorbing to the wafer 8 will be described. In the experiment, particles adsorbing to the wafer 8 were counted by changing the applied voltage HV and the pressure BP of the heat transfer gas in the periods T1 and T2 of the substrate processing method according to the embodiment to change the temperature of the wafer 8. The size of the wafer 8 is 150 mm in radius. In the experiment, the number of particles adsorbing to the edge region of the wafer 8 was counted. The edge region of the wafer 8 is a region outside the radius 120 mm of the wafer 8. FIG. 10 is a graph showing the average values of the number of particles adsorbing to the edge region of the wafer 8. "2500V30T" indicates a case where the applied voltage HV is set to 2500 V and the pressure BP of the heat transfer gas is set to 30 Torr in the periods T1 and T2. That is, in the "2500V30T", similarly to the substrate processing method in the related art illustrated in FIG. 2, the temperature of the electrostatic chuck 6 and the temperature of the wafer 8 are changed from 80° C. to 30° C. without changing the applied voltage HV and the pressure BP of the heat transfer gas. "1500V20T" indicates a case where the applied voltage HV is set to 1500 V, the pressure BP of the heat transfer gas is set to 0 Torr in the period T1, and the pressure BP of the heat transfer gas is changed to 20 Torr in the period T2. "1000V10T" indicates a case where the applied voltage HV is set to 1000 V, the pressure BP of the heat transfer gas is set to 0 Torr in the period T1, and the pressure BP of the heat transfer gas is changed to 10 Torr in the period T2. FIG. 10 is a graph showing the average values of the number of particles adsorbing to the edge regions of two wafers 8 for each of "2500V30T", "1500V20T", and "1000V10T". "1500V20T" and "1000V10T" have a smaller average value of the number of particles than "2500V30T". That is, "1500V20T" and "1000V10T" can suppress the adsorption of particles to the wafer 8 further than the substrate processing method of the related art illustrated in FIG. 2. In addition, "1000V10T" has a smaller average number of particles than "1500V20T". That is, "1000V10T" can most suppress the adsorption of particles to the wafer 8.

[Effect]

As described above, the substrate processing method according to the embodiment is a substrate processing method for the wafer 8 (substrate) by the substrate processing apparatus 100. The substrate processing apparatus 100 includes a processing chamber 1, a susceptor 2, an electrostatic chuck 6 (attraction unit), and a heat transfer gas supply unit 25 (gas supply unit). The susceptor 2 is disposed in the processing chamber 1. The electrostatic chuck 6 is provided on the susceptor 2, is capable of changing the temperature, and electrostatically attracts the wafer 8 according to the applied voltage. The heat transfer gas supply unit 25 supplies the gas for heat transfer between the electrostatic chuck 6 and the wafer 8 disposed on the electrostatic chuck 6. The substrate processing method includes a step of changing the pressure of the gas supplied from the heat transfer gas supply unit 25 between the wafer 8 and the electrostatic chuck 6 from a first pressure to a second pressure that is lower than the first pressure, a step of changing the applied voltage applied to the electrostatic chuck 6 from a first voltage to a second voltage that is lower than the first voltage, a step of changing a temperature of the electrostatic chuck 6 from a first temperature to a second temperature, a step of electrostatically attracting and holding the wafer 8 by the electrostatic chuck 6 for a first time in a state where the pressure of the gas supplied from the heat transfer gas supply unit 25 is set to the second pressure and the applied voltage applied to the electrostatic chuck 6 is set to the second voltage, a step of changing the pressure of the gas supplied from the heat transfer gas supply unit 25 from the second pressure to a third pressure that is lower than the first pressure and higher than the second pressure, and a step of changing the applied voltage applied to the electrostatic chuck 6 from the second voltage to a third voltage that is higher than the second voltage. As such, the substrate processing method according to the embodiment can suppress the adsorption of particles to the wafer 8.

In addition, the substrate processing method according to the embodiment further includes a step of performing the first process on the wafer 8 at the first temperature before the step of changing to the second pressure and a step of performing the second process on the wafer 8 at the second temperature after the step of changing to the third voltage. As such, the substrate processing method according to the embodiment suppresses the adsorption of particles to the wafer 8 in a case where the temperature of the wafer 8 is changed between the processing of the first process and the processing of the second process.

In addition, the substrate processing method according to the embodiment further includes a step of changing the pressure of the gas supplied from the heat transfer gas supply unit 25 from the third pressure to a fourth pressure higher than the third pressure after the step of changing to the third voltage. Therefore, the substrate processing method according to the embodiment can improve the heat transfer and improve the temperature followability of the wafer 8.

In addition, in the substrate processing method according to the embodiment, the first pressure and the fourth pressure are equal to each other. As such, the substrate processing method according to the embodiment can control the temperature of the wafer 8 by controlling the temperature of the electrostatic chuck 6.

In addition, in the substrate processing method according to the embodiment, the first voltage and the third voltage are equal to each other. As such, in the substrate processing method according to the embodiment, the wafer 8 can be stably held by the electrostatic chuck 6.

In addition, in the substrate processing method according to the embodiment, in the step of changing to the second pressure, the gas supplied from the heat transfer gas supply unit 25 is exhausted to an exhaust system, so that the pressure of the gas supplied between the wafer 8 and the electrostatic chuck 6 is changed from the first pressure to the second pressure that is lower than the first pressure. Therefore, the substrate processing method according to the embodiment can change the pressure of the gas supplied between the wafer 8 and the electrostatic chuck 6 without changing the pressure of the gas supplied from the heat transfer gas supply unit 25. In addition, by changing the pressure of the gas into the second pressure that is lower than the first pressure, it is possible to suppress flying-up of particles from the outer periphery of the wafer 8.

In addition, in the substrate processing method according to the embodiment, the first temperature is set to be higher than the second temperature. As such, the substrate processing method according to the embodiment can suppress the adsorption of particles to the wafer 8 even in a case where the temperature of the wafer 8 is changed.

In addition, the substrate processing method according to the embodiment supplies radio frequency power to the susceptor 2 in the step of changing the applied voltage applied to the electrostatic chuck 6. Therefore, the substrate processing method according to the embodiment can suppress a rapid change in potential of the wafer 8 when the applied voltage applied to the electrostatic chuck 6 is changed.

Heretofore, although the embodiments have been described, the embodiments disclosed this time should be considered as illustrative but not restrictive in all points. Indeed, the above-described embodiments may be realized in various forms. In addition, the above-described embodiments may be omitted, replaced, or modified in various forms without departing from the scope and spirit of the claims.

For example, in the embodiments described above, a case where the temperature of the wafer 8 is decreased by the substrate processing method is described as an example. However, the invention is not limited thereto. Even in a case where the temperature of the wafer 8 is increased, similarly to a case where the temperature of the wafer 8 is decreased, the contact portion between the wafer 8 and the electrostatic chuck 6 is rubbed and scratched, and particles PA occur. Therefore, the substrate processing method according to the embodiment can suppress the adsorption of particles to the wafer 8 even in a case where changing to increase the temperature of the wafer 8 is performed.

In addition, in the above-described embodiments, a case where, in the period T1 of FIG. 4, the control unit 90 waits for the time ta3 to elapse and, thus, the temperature of the wafer 8 is decreased to a temperature close to the temperature of the susceptor 2 is described as an example. However, the invention is not limited thereto. The control unit 90 may perform control by detecting the actual temperature of the electrostatic chuck 6. For example, a detection unit such as a temperature sensor that detects the temperature of the electrostatic chuck 6 is provided to the electrostatic chuck 6 or base 2a. The control unit 90 electrostatically attracts and holds the wafer 8 by the electrostatic chuck 6 until the difference between the temperature of the electrostatic chuck 6 detected by the temperature sensor and the second temperature is within a predetermined value. Subsequently, when the difference between the temperature of the electrostatic chuck 6 and the second temperature is within the predetermined value, the control unit 90 may change the pressure of the gas supplied from the heat transfer gas supply unit 25 from the second pressure to the third pressure that is lower than the first pressure and higher than the second pressure.

In addition, in the substrate processing method according to the embodiment described above, a case where the power of the radio frequency power RF is changed rapidly is described as an example. However, the invention is not limited thereto. The control unit 90 may gradually reduce the power of the radio frequency power RF in at least a portion of the period when the radio frequency power RF is changed. For example, the control unit 90 may gradually reduce the radio frequency power HF for plasma generation or the radio frequency power LF for bias from 100 W to 0 W in the period T1.

In addition, in the above-described embodiments, a case where the substrate processing apparatus 100 is a capacitively coupled plasma processing apparatus is described as an example. However, the invention is not limited thereto. The substrate processing method according to the embodiment can be employed in any plasma processing apparatus. For example, the substrate processing apparatus 100 may be an arbitrary type of plasma processing apparatus such as an inductively coupled plasma processing apparatus or a plasma processing apparatus that excites gas by surface waves such as microwaves.

In addition, in the above-described embodiments, a case where the first radio frequency power supply 10a and the second radio frequency power supply 10b are connected to the base 2a is described as an example, but the configuration of the plasma source is not limited thereto. For example, the first radio frequency power supply 10a for plasma generation may be connected to the shower head 16 having a function as an upper electrode. In addition, the second radio frequency power supply 10b for ion attraction (for bias) may not be connected to the base 2a.

In addition, although the substrate processing apparatus 100 described above is a plasma processing apparatus that performs etching as plasma processing, it may be employed in a plasma processing apparatus that performs arbitrary plasma processing. For example, the substrate processing apparatus 100 may be a single-wafer deposition apparatus that performs chemical vapor deposition (CVD), atomic layer deposition (ALD), physical vapor deposition (PVD) and may be a plasma processing apparatus that performs plasma annealing, plasma implantation, or the like.

In addition, in the above-described embodiments, a case where the substrate is a semiconductor wafer is described as an example, but the invention is not limited thereto. The substrate may be other substrates such as a glass substrate.

According to the disclosure, it is possible to suppress adsorption of particles to the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method by a substrate processing apparatus having
    a processing chamber;
    a susceptor that is disposed in the processing chamber, and includes an electrostatic chuck that is capable of changing a temperature, and electrostatically attracts a substrate according to an applied voltage, the substrate being disposed on the electrostatic chuck; and
    a gas supply unit that supplies a gas for heat transfer to a gap between the substrate disposed on the electrostatic chuck and the electrostatic chuck, the substrate processing method comprising:

changing a pressure of the gas supplied from the gas supply unit to the gap from a first pressure to a second pressure that is lower than the first pressure;

changing the applied voltage applied to the electrostatic chuck from a first voltage to a second voltage that is lower than the first voltage;

changing the temperature of the electrostatic chuck from a first temperature to a second temperature;

electrostatically attracting and holding the substrate by the electrostatic chuck for a first time in a state where the pressure of the gas supplied from the gas supply unit is set to the second pressure and the applied voltage applied to the electrostatic chuck is set to the second voltage;

changing the pressure of the gas supplied from the gas supply unit from the second pressure to a third pressure that is lower than the first pressure and higher than the second pressure; and changing the applied voltage applied to the electrostatic chuck from the second voltage to a third voltage that is higher than the second voltage.

2. The substrate processing method according to claim 1, further comprising:

performing a first process on the substrate at the first temperature before the changing to the second pressure, and performing a second process on the substrate at the second temperature after the changing to the third voltage.

3. The substrate processing method according to claim 1, further comprising changing the pressure of the gas supplied from the gas supply unit from the third pressure to a fourth pressure that is higher than the third pressure after the changing to the third voltage.

4. The substrate processing method according to claim 3, wherein the first pressure and the fourth pressure are equal to each other.

5. The substrate processing method according to claim 1, wherein the first voltage and the third voltage are equal to each other.

6. The substrate processing method according to claim 1, wherein, in the changing to the second pressure, the gas supplied from the gas supply unit is exhausted to an exhaust system, so that the pressure of the gas supplied to the gap is changed from the first pressure to the second pressure that is lower than the first pressure.

7. The substrate processing method according to claim 1, wherein a radio frequency power is supplied to the susceptor, and wherein, when the temperature of the electrostatic chuck is changed from the first temperature to the second temperature, the radio frequency power supplied to the susceptor is turned off.

8. The substrate processing method according to claim 1, wherein the first temperature is higher than the second temperature.

9. The substrate processing method according to claim 1, wherein the first temperature is lower than the second temperature.

10. The substrate processing method according to claim 1, wherein the substrate processing apparatus further includes a detection unit that detects the temperature of the electrostatic chuck, wherein, in the electrostatically attracting and holding the substrate, the substrate is electrostatically attracted and held by the electrostatic chuck until a difference between the temperature of the electrostatic chuck detected by the detection unit and the second temperature is within a predetermined value, and wherein, in the changing to the third pressure, when the difference between the temperature of the electrostatic chuck and the second temperature is within the predetermined value, the pressure of the gas supplied from the gas supply unit is changed from the second pressure to the third pressure that is lower than the first pressure and higher than the second pressure.

11. The substrate processing method according to claim 1, wherein, in the changing the applied voltage applied to the electrostatic chuck, a radio frequency power is supplied to the susceptor.

12. The substrate processing method according to claim 1, wherein the susceptor is in a grounded state during a period in which a temperature of the substrate is changed.

* * * * *